US010975263B2

(12) United States Patent
Kido et al.

(10) Patent No.: US 10,975,263 B2
(45) Date of Patent: Apr. 13, 2021

(54) THERMOSETTING RESIN COMPOSITION, CURED FILM AND METHOD FOR PRODUCING SAME, AND FLEXIBLE PRINTED BOARD WITH CURED FILM AND METHOD FOR PRODUCING SAME

(71) Applicant: KANEKA CORPORATION, Osaka (JP)

(72) Inventors: Masayoshi Kido, Otsu (JP); Tetsuya Kogiso, Otsu (JP); Tomohiro Koda, Otsu (JP); Yuji Asahina, Otsu (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/092,152

(22) PCT Filed: Apr. 21, 2017

(86) PCT No.: PCT/JP2017/016059
§ 371 (c)(1),
(2) Date: Oct. 8, 2018

(87) PCT Pub. No.: WO2017/188155
PCT Pub. Date: Nov. 2, 2017

(65) Prior Publication Data
US 2019/0161638 A1    May 30, 2019

(30) Foreign Application Priority Data
Apr. 25, 2016   (JP) .............................. JP2016-086773

(51) Int. Cl.
| | | |
|---|---|---|
| C09D 163/04 | (2006.01) | |
| H05K 1/03 | (2006.01) | |
| C08L 63/00 | (2006.01) | |
| C08K 5/00 | (2006.01) | |
| C08K 5/10 | (2006.01) | |
| C08K 5/49 | (2006.01) | |
| C09D 7/40 | (2018.01) | |
| C09D 5/18 | (2006.01) | |
| C09D 133/10 | (2006.01) | |
| C09D 163/00 | (2006.01) | |
| C09D 175/04 | (2006.01) | |
| H05K 3/28 | (2006.01) | |

(52) U.S. Cl.
CPC .............. *C09D 163/04* (2013.01); *C08K 5/00* (2013.01); *C08K 5/10* (2013.01); *C08K 5/49* (2013.01); *C08L 63/00* (2013.01); *C09D 5/18* (2013.01); *C09D 7/70* (2018.01); *C09D 133/10* (2013.01); *C09D 163/00* (2013.01); *C09D 175/04* (2013.01); *H05K 1/03* (2013.01); *H05K 1/0373* (2013.01); *H05K 1/0393* (2013.01); *H05K 3/285* (2013.01); *H05K 2201/012* (2013.01)

(58) Field of Classification Search
None
See application file for complete search history.

(56) References Cited

U.S. PATENT DOCUMENTS

| | | | | |
|---|---|---|---|---|
| 9,835,942 B2 * | 12/2017 | Sekito | ..................... | H05K 3/287 |
| 2002/0115739 A1 * | 8/2002 | Ohno | ..................... | C08F 220/06 522/1 |
| 2005/0234173 A1 * | 10/2005 | Tsuchikawa | ............... | C08J 5/24 524/415 |
| 2007/0293636 A1 | 12/2007 | Kimura et al. | | |
| 2010/0079701 A1 * | 4/2010 | Murayama | ........... | G02B 5/0226 349/64 |
| 2010/0133703 A1 * | 6/2010 | Karasawa | .............. | C08G 59/38 257/777 |
| 2013/0183499 A1 | 7/2013 | Kido et al. | | |

FOREIGN PATENT DOCUMENTS

| | | |
|---|---|---|
| CN | 100569825 | 12/2009 |
| JP | 5-75032 A | 3/1993 |
| JP | 2006-117922 A | 5/2006 |
| JP | 2014-71325 A | 4/2014 |
| JP | 2014-120578 A | 6/2014 |
| TW | 201224087 | 6/2012 |
| WO | WO 2006/008995 A1 | 1/2006 |

OTHER PUBLICATIONS

Extended European Search Report dated Nov. 20, 2019, in European Patent Application No. 17789438.3.
International Search Report dated Jul. 11, 2017, in PCT/JP2017/016059 filed Apr. 21, 2017.
International Preliminary Report on Patentability and Written Opinion dated Nov. 8, 2018 in PCT/JP2017/016059 (English translation only).
First Office Action dated May 6, 2020, in Chinese patent application No. 201780025862.1 (w/English translation) (25 pages).
Office Action dated Nov. 26, 2020, in Taiwanese Patent Application No. 106113688, (8 pages).

* cited by examiner

*Primary Examiner* — Megan McCulley
(74) *Attorney, Agent, or Firm* — Oblon, McClelland, Maier & Neustadt, L.L.P.

(57) ABSTRACT

A thermosetting resin composition contains an epoxy resin, a curing accelerator, a compound having a (meth) acryloyl group, and a compound having an acidic functional group and a weight average molecular weight of 1000 or more. The thermosetting resin composition may further contain a phosphorus-based flame retardant, organic spherical beads, and the like. The thermosetting resin composition preferably substantially does not contain a photopolymerization initiator and a thermal polymerization initiator. The thermosetting resin composition can be used, for example, for forming a cured film on a flexible printed wiring board.

14 Claims, No Drawings

THERMOSETTING RESIN COMPOSITION, CURED FILM AND METHOD FOR PRODUCING SAME, AND FLEXIBLE PRINTED BOARD WITH CURED FILM AND METHOD FOR PRODUCING SAME

TECHNICAL FIELD

The present invention relates to a thermosetting resin composition, a cured film and a method for producing the cured film, and a flexible printed board with the cured film and a method for producing the flexible printed board with the cured film.

TECHNICAL BACKGROUND

An insulating cured resin film is provided on circuits of a flexible printed board used in various electronic devices in order to maintain insulation reliability. In recent years, there have been advancements in miniaturization and reduction in thickness of electronic devices represented by smartphones and tablets, and a specification that corresponds to miniaturization and reduction in thickness is required for a flexible printed board used for an electronic device. For example, there have been advancements in forming circuits of a wiring board at a fine pitch, and fine integration is required.

Since an ultraviolet curable resin has a poor flexibility, a thermosetting resin is used for a cured resin film of a flexible printed board which is required to have high foldability by fine integration. Patent Document 1 discloses a thermosetting resin composition containing an epoxy resin and a dibasic acid anhydride as essential components. Patent Document 2 discloses a thermosetting resin composition containing polyurethane and an epoxy resin, the polyurethane having a urethane bond formed by a reaction between polycarbonate diol and polyisocyanate and having two or more carboxyl groups in one molecule.

RELATED ART

Patent Documents

Patent Literature 1: Japanese Patent Publication No. HEI 5-75032.
Patent Document 2: Japanese Patent Laid-Open Publication No. 2006-117922.

SUMMARY OF THE INVENTION

Problems to be Solved by the Invention

In the conventional thermosetting resin compositions disclosed in Patent Document 1 and Patent Document 2, it is difficult to achieve both good heat resistance and good flexibility in a cured film. Further, when a cured film is formed on a flexible substrate such as a flexible printed board, the substrate may greatly warp due to thermal history in processing after curing, and handling of the substrate may become difficult, and an operational problem in process inspection and the like may occur. Further, due to warping, a decrease in positioning accuracy when a component is mounted on the substrate may be a problem.

In view of the above-described situation, the present invention is intended to provide a cured film that allows a substrate to have a small warpage even having been subjected to a processing thermal history, and to provide a thermosetting resin composition for forming the cured film.

Means for Solving the Problems

A thermosetting resin composition of the present invention contains (A) an epoxy resin, (B) a curing accelerator, (C) a compound having a (meth) acryloyl group, and (D) a compound having an acidic functional group and a weight average molecular weight of 1000 or more. The thermosetting resin composition may further contain a phosphorus-based flame retardant, organic spherical beads, and the like. The thermosetting resin composition preferably substantially does not contain a photopolymerization initiator and a thermal polymerization initiator.

A cured film is obtained by thermally curing the thermosetting resin composition. For example, a flexible printed board with a cured film is obtained by applying the thermosetting resin composition on a surface of a flexible printed board to form a coating film and applying heat to the coating film. In the cured film of the present invention, a portion or all of the component (C) in the thermosetting resin composition may remain unreacted. The thermally cured film preferably has a relaxation time of 1000 seconds or less.

Effect of Invention

The thermosetting resin composition of the present invention containing (A) an epoxy resin as a thermosetting resin, (B) a curing accelerator, (C) a (meth) acryloyl group-containing compound, and (D) an acidic functional group-containing compound allows a substrate to have a small warpage even having been subjected to a processing thermal history after the formation of the cured film. Therefore, the thermosetting resin composition of the present invention can be suitably used as a protective film for various circuit boards such as a flexible printed wiring board.

MODE FOR CARRYING OUT THE INVENTION

A thermosetting resin composition of the present invention contains (A) an epoxy resin as a thermosetting resin, (B) a thermosetting accelerator, (C) a (meth) acryloyl group-containing compound, and (D) an acidic functional group-containing compound. In the following, details of the components are sequentially described. The following components may each be independently used, or two or more of the components may be used in combination.

<(A) Thermosetting Resin>

The thermosetting resin composition of the present invention contains an epoxy resin as the component (A) (a thermosetting resin). A polyfunctional epoxy resin having 2 or more epoxy groups in one molecule can impart heat resistance to an insulating cured film obtained by curing the thermosetting resin composition and can impart adhesiveness with respect to a conductor such as a metal or with respect to a circuit board, and thus is preferably used as the epoxy resin of the component (A).

The polyfunctional epoxy resin is a compound containing at least 2 epoxy groups in a molecule, and examples of the polyfunctional epoxy resin include a bisphenol A type epoxy resin, a bisphenol F type epoxy resin, a bisphenol S type epoxy resin, a hydrogenated bisphenol A type epoxy resin, a biphenyl type epoxy resin, a phenoxy type epoxy resin, a naphthalene type epoxy resin, a phenol novolak type epoxy resin, a cresol novolak type epoxy resin, a trisphenol methane type epoxy resin, a dicyclopentadiene type epoxy resin, an amine type epoxy resin, and the like. The epoxy resin may be an epoxy resin modified with urethane, rubber, chelate, dimer acid or the like. As the epoxy resin of the component (A), a commercially available epoxy resin may be used as it is.

Among the epoxy resins, when a dimer acid-modified epoxy resin is used as the component (A), a relaxation time of the cured film tends to be decreased and a warpage of a substrate on which the cured film is formed tends to be reduced. A dimer acid-modified epoxy resin is obtained by causing a polyfunctional epoxy resin to react with at least one carboxyl group in a dimer acid structure. A dimer acid is a dimer of an unsaturated fatty acid. As an unsaturated fatty acid as a raw material of a dimer acid, an unsaturated fatty acid having 18 carbon atoms such as an oleic acid or a linoleic acid is preferable. For example, a dimer acid can be obtained by polymerization of plant-derived fat and oil mainly composed of an unsaturated fatty acid having 18 carbon atoms. A structure of a dimer acid may be either cyclic or acyclic. Examples of commercially available dimer acid-modified epoxy resins include "jER871" and "jER872" manufactured by Mitsubishi Chemical Corporation, "YD-171" and "YD-172" manufactured by Nippon Steel Chemical Co., Ltd., and the like.

From a point of view of heat resistance, chemical resistance and the like of the cured film, an epoxy equivalent (weight (g) of a compound containing one equivalent of epoxy groups) of the epoxy resin is preferably 2000 or less, and more preferably 1500 or less. A weight average molecular weight of the epoxy resin is preferably about 150-3000, and more preferably about 200-2000.

<(B) Curing Accelerator>

A curing accelerator is a compound that promotes thermal curing of the component (A). As the component (B), a curing accelerator of an epoxy resin can be used without limitation. The curing accelerator is preferably a low molecular weight compound having a molecular weight of 900 or less. From a point of view of ensuring a pot life of the thermosetting resin composition, as the component (B), a thermosetting curing accelerator is preferable.

Specific examples of the thermosetting curing accelerator include phosphine-based compounds such as triphenylphosphine; phosphonium salts such as tetraphenylphosphonium; amine-based compounds such as trimethanolamine, triethanolamine, and tetraethanolamine; borate salts such as tetraphenylborate; imidazoles such as imidazole, 2-ethylimidazole, 2-ethyl-4-methylimidazole, 2-phenylimidazole, 2-undecylimidazole, 1-benzyl-2-methylimidazole, 2-heptadecylimidazole, 2-isopropylimidazole, 2,4-dimethylimidazole, and 2-phenyl-4-methylimidazole; imidazolines such as 2-methylimidazoline, 2-ethylimidazoline, 2-isopropylimidazoline, 2-phenylimidazoline, 2-undecylimidazoline, 2,4-dimethylimidazoline, and 2-phenyl-4-methylimidazoline; azine-based imidazoles such as 2,4-diamino-6-[2'-methylimidazolyl-(1')]-ethyl-s-triazine, 2,4-diamino-6-[2'-undecylimidazolyl-(1')]-ethyl-s-triazine, and 2,4-Diamino-6-[2'-ethyl-4'-methylimidazolyl-(1')]-ethyl-s-triazine; dicyandiamide; and the like.

<(C) (Meth) Acryloyl Group-Containing Compound>

The thermosetting resin composition of the present invention contains a (meth) acryloyl group-containing compound as the component (C). The (meth) acryloyl group-containing compound is a compound having at least one (meth) acryloyl group in a molecule, and may be any one of a monomer, an oligomer and a polymer. In the present specification, "(meth) acrylic" means "acrylic" or "methacrylic," and "(meth) acryloyl" means "acryloyl" or "methacryloyl."

Specific examples of the (meth) acryloyl group-containing compound include bisphenol EO-modified (n=2-50) diacrylate, bisphenol A EO-modified (n=2-50) diacrylate, bisphenol S EO-modified (n=2-50) diacrylate, bisphenol F EO-modified (n=2-50) dimethacrylate, bisphenol A EO-modified (n=2-50) dimethacrylate, bisphenol S EO-modified (n=2-50) dimethacrylate, 1,6-hexanediol diacrylate, neopentyl glycol diacrylate, ethylene glycol diacrylate, pentaerythritol diacrylate, trimethylolpropane triacrylate, pentaerythritol triacrylate, dipentaerythritol hexaacrylate, tetramethylolpropane tetraacrylate, tetraethylene glycol diacrylate, 1,6-hexanediol dimethacrylate, neopentyl glycol dimethacrylate, ethylene glycol dimethacrylate, pentaerythritol dimethacrylate, trimethylolpropane trimethacrylate, pentaerythritol trimethacrylate, dipentaerythritol hexamethacrylate, tetramethylolpropane tetramethacrylate, tetraethylene glycol dimethacrylate, methoxydiethylene glycol methacrylate, methoxy polyethylene glycol methacrylate, β-methacryloyloxyethyl hydrogen phthalate, β-methacryloyloxyethyl hydrogen succinate, 3-chloro-2-hydroxypropyl methacrylate, stearyl methacrylate, phenoxyethyl acrylate, phenoxydiethylene glycol acrylate, phenoxy polyethylene glycol acrylate, β-acryloyloxyethyl hydrogen succinate, lauryl acrylate, ethylene glycol dimethacrylate, diethylene glycol dimethacrylate, triethylene glycol dimethacrylate, polyethylene glycol dimethacrylate, 1,3-butylene glycol dimethacrylate, 1,6-hexanediol dimethacrylate, neopentyl glycol dimethacrylate, polypropylene glycol dimethacrylate, 2-hydroxy-1,3-dimethacryloxypropane, 2,2-bis [4-(methacryloxyethoxy) phenyl]propane, 2,2-bis [4-(methacryloxy•diethoxy) phenyl]propane, 2,2-bis [4-(methacryloxy-polyethoxy) phenyl]propane, polyethylene glycol diacrylate, tripropylene glycol diacrylate, polypropylene glycol diacrylate, 2,2-bis [4-(acryloxy-diethoxy) phenyl] propane, 2,2-bis [4-(acryloxy-polyethoxy) phenyl]propane, 2-hydroxy-1-acryloxy-3-methacryloxypropane, trimethylolpropane trimethacrylate, tetramethylolmethane triacrylate, tetramethylolmethane tetraacrylate, methoxydipropylene glycol methacrylate, methoxytriethylene glycol acrylate, nonylphenoxy polyethylene glycol acrylate, nonylphenoxy polypropylene glycol acrylate, 1-acryloyloxypropyl-2-phthalate, isostearyl acrylate, polyoxyethylene alkyl ether acrylate, nonylphenoxyethylene glycol acrylate, polypropylene glycol dimethacrylate, 1,4-butanediol dimethacrylate, 3-methyl-1,5-pentanediol dimethacrylate, 1,6-hexanediol dimethacrylate, 1,9-nonanediol methacrylate, 2,4-diethyl-1,5-pentanediol dimethacrylate, 1,4-cyclohexane dimethanol dimethacrylate, dipropylene glycol diacrylate, tricyclodecane dimethanol diacrylate, 2,2-hydrogenated bis [4-(acryloxy-polyethoxy) phenyl]propane, 2,2-bis [4-(acryloxy-polypropoxy) phenyl]propane, 2,4-diethyl-1,5-pentanediol diacrylate, ethoxylated trimethylolpropane triacrylate, propoxylated trimethylolpropane triacrylate, isocyanuric acid tri (ethane acrylate), pentaslitol tetraacrylate, ethoxylated pentaslitol tetraacrylate, propoxylated pentaslitol tetraacrylate, ditrimethylolpropane tetraacrylate, dipentaerythritol polyacrylate, triallyl isocyanurate, glycidyl methacrylate, glycidyl allyl ether, 1,3,5-triacryloylhexahydro-s-triazine, triallyl 1,3,5-benzenecarboxylate, triallylamine, triallyl citrate, triallyl phosphate, allobarbital, diallylamine, diallyldimethylsilane, diallyl disulfide, diallyl ether, diallyl cyanurate, diallyl isophthalate, diallyl terephthalate, 1,3-diaryloxy-2-propanol, diallyl sulfide diallyl maleate, 4,4'-isopropylidenediphenol dimethacrylate, 4,4'-isopropylidenediphenol diacrylate, a urethane (meth) acrylate compound, an epoxy (meth) acrylate compound, a polyester (meth) acrylate compound, an acrylic (meth) acrylate compound, and the like. As the component (C), a commercially available (meth) acrylate compound may be used as it is.

From a point of view of insulation reliability of the cured film, the (meth) acryloyl group-containing compound of the component (C) preferably contains 2 or more (meth) acryloyl groups in one molecule. In particular, a cured film obtained from a thermosetting resin composition containing a urethane (meth) acrylate compound as the component (C) has excellent flexibility and can reduce the warpage of the substrate and thus is preferable.

The component (C) is a component that acts as a plasticizer in the cured film and can contribute to stress relaxation. Therefore, the (meth) acryloyl group-containing compound is preferably low-volatile or non-volatility, and an oligomer or polymer having a low molecular weight or medium molecular weight is preferable. A weight average molecular weight of the (meth) acryloyl group-containing compound is preferably about 150-20,000, more preferably about 200-15,000, and even more preferably about 300-10,000.

<(D) Acidic Functional Group-Containing Compound>

The thermosetting resin composition of the present invention contains an acidic functional group-containing compound as the component (D). The acidic functional group-containing compound is a compound that has at least one acidic functional group in a molecule and has a molecular weight of 1,000 or more. An acidic functional group preferably reacts with an epoxy group of the component (A), and examples of the acidic functional group include a carboxyl group, a phenolic hydroxy group, and the like. From a point of view of reactivity with an epoxy resin and storage stability, the acidic functional group-containing compound preferably contains a carboxyl group. The acidic functional group may be a carboxylic acid anhydride group.

The acid value of the acidic functional group-containing compound is preferably 5-200 mgKOH/g, more preferably 10-150 mgKOH/g, and even more preferably 15-100 mgKOH/g. When the acidic functional group-containing compound as the component (D) has an appropriate acid value, a crosslink density with the epoxy resin as the component (A) is increased, and heat resistance, insulation reliability and chemical resistance of the cured film can be improved.

A weight average molecular weight of the acidic functional group-containing compound based on polyethylene glycol conversion is preferably 1,000-1,000,000, more preferably 2,000-200,000, even more preferably 3,000-100,000, and particularly preferably 4,000-50,000. When the weight average molecular weight of the acidic functional group-containing compound is within the above range, viscosity of the thermosetting resin composition can be adjusted to a range suitable for application by screen printing or the like, and flexibility and chemical resistance of the cured film tend to be improved.

Specific examples of the acidic functional group-containing compound include a carboxyl group-containing (meth) acrylic polymer, a carboxyl group-containing vinyl-based polymer, acid-modified polyurethane, acid-modified polyester, acid-modified polycarbonate, acid-modified polyamide, acid-modified polyimide, acid-modified polyurethane amide, acid modified polyurethane imide, and the like. From a point of view of flexibility, insulation reliability, chemical resistance, and the like of the cured film, a carboxyl group-containing (meth) acrylic copolymer, acid-modified polyurethane, acid-modified polyamide, acid-modified polyimide, acid-modified polyurethane amide, and acid-modified polyurethane imide are preferable.

The acidic functional group-containing compound as the component (D) can be obtained using various commonly known methods. Polymerization may be either solution polymerization or solvent-free polymerization. However, in order to control the reaction, solution polymerization is preferable. As an organic solvent for solution polymerization, any organic solvent capable of dissolving both a monomer component and a polymer after polymerization can be used without particular limitation. A solvent amount in solution polymerization may be adjusted such that ae solution concentration is 5-90 weight %, and preferably 20-70 weight %.

The carboxyl group-containing (meth) acrylic polymer is a copolymer that contains, as monomer components, (meth) acrylic acid ester and a compound having a carboxyl group and a polymerizable double bond in one molecule. Examples of carboxyl group-containing monomers include (meth) acrylic acid, crotonic acid, isocrotonic acid, myristoleic acid, palmitoleic acid, oleic acid, elaidic acid, vaccinic acid, gadoleic acid, eicosenoic acid, erucic acid, nervonic acid, ω-carboxy-polycaprolactone mono (meth) acrylate, monohydroxyethyl (meth) acrylate phthalate, (meth) acrylic acid dimer, 2-(meth) acryloyloxypropyl hexahydrophthalic acid, 2-(meth) acryloyloxyethyl succinic acid, maleic acid, fumaric acid, citraconic acid, mesaconic acid, atropaic acid, cinnamic acid, linoleic acid, eicosadienoic acid, docosadienoic acid, linolenic acid, pinolenic acid, eleostearic acid, mead acid, dihomo-Y-linolenic acid, eicosatrienoic acid, stearidonic acid, arachidonic acid, eicosatetraenoic acid, adrenic acid, bose-propenoic acid, eicosapentaenoic acid, osbondic acid, sardines acid, tetracosapentaenoic acid, docosahexaenoic acid, nisinic acid, 2,2,2-trisacryloyloxymethyl-succinic acid, 2-trisacryloyloxymethylethyl phthalic acid, and the like. As (meth) acrylic acid ester, (meth) acrylic acid alkyl ester is preferable.

In addition to a carboxyl group-containing monomer and (meth) acrylic acid ester, the carboxyl group-containing (meth) acrylic polymer may include, as copolymerization components, acrylamide such as diacetone acrylamide, esters of vinyl alcohol such as acrylonitrile and vinyl-n-butyl ether, styrene, vinyl toluene, and the like. The carboxyl group-containing (meth) acrylic polymer can be obtained, for example, by radical polymerization of the above-described monomer components. The radical polymerization may be thermal polymerization or photopolymerization. For the radical polymerization, a polymerization initiator may be used. The carboxyl group-containing (meth) acrylic polymer is preferably obtained by solution polymerization using an azo compound, organic peroxide, persulfate, hydrogen peroxide or the like as a thermal polymerization initiator.

The acid-modified polyimide is obtained, for example, by a reaction between a diisocyanate compound and a tetracarboxylic acid dianhydride. By adding the tetracarboxylic acid dianhydride in an amount exceeding an equivalent amount of the diisocyanate compound, an imide compound having a carboxylic acid anhydride group at a terminal is obtained. By causing water and/or a primary alcohol such as methanol, ethanol, propanol, and butanol to react with the imide compound having a carboxylic acid anhydride group at a terminal, an imide compound having a carboxyl group at a terminal is obtained. The diisocyanate compound may be either an alicyclic diisocyanate compound or an aliphatic diisocyanate compound and may be a urethane compound having an isocyanate group at a terminal. The tetracarboxylic acid dianhydride may be either an aromatic tetracarboxylic acid dianhydride or an aliphatic tetracarboxylic acid dianhydride, and an aromatic tetracarboxylic acid dianhydride having a carboxylic acid anhydride group directly bonded to an aromatic ring is preferable.

The acid-modified polyamide is a compound having an amic acid structure, and is obtained, for example, by a reaction between a diamino compound and a tetracarboxylic acid dianhydride.

The acidic functional group-containing compound as the component (D) may have a polymerizable unsaturated bond such as a (meth) acryloyl group or a vinyl group in a molecule. A compound having an acidic functional group and having a (meth) acryloyl group in a molecule can be both the component (C) and the component (D), however, it is to be regarded as the component (D).

When the thermosetting resin composition contains a compound having an acidic functional group and a polymerizable unsaturated double bond in a molecule as the component (D), the component (D) also reacts with the (meth) acryloyl group of the component (C) in addition to the epoxy group of the component (A). Therefore, a crosslink density of the cured film is increased, and the heat resistance and the chemical resistance of the cured film tend to be improved.

Examples of the compound having an acidic functional group and a polymerizable unsaturated double bond in a molecule include: an epoxy acrylate obtained by adding a saturated or unsaturated polyvalent carboxylic acid anhydride to an ester obtained by causing an epoxy resin and an unsaturated monocarboxylic acid to react with each other; a urethane acrylate which is a polymer of a diol compound having an ethylenically unsaturated group and/or a carboxyl group and a diisocyanate compound; a (meth) acrylated (meth) acrylate obtained by causing a part of a carboxyl group of a side chain of a copolymer of a (meth) acrylic acid (having a carboxyl group and a polymerizable double bond) and a (meth) acrylic ester or the like to react with an epoxy group of a compound (such as glycidyl methacrylate) having a (meth) acryl group and an epoxy group; and the like. Examples of the saturated or unsaturated polyvalent basic acid anhydride used for the synthesis of the epoxy acrylate include anhydrides of phthalic acid, tetrahydrophthalic acid, hexahydrophthalic acid, maleic acid, succinic acid, trimellitic acid, and the like.

<Contents of Components>

A content of the epoxy resin as the component (A) in the thermosetting resin composition with respect to a total solid content of 100 parts by weight is preferably 1-80 parts by weight, more preferably 5-50 parts by weight, and particularly preferably 10-30 parts by weight. In addition to the epoxy resin as the component (A), the thermosetting resin composition may contain a thermosetting resin other than the epoxy resin. A content of the curing accelerator as the component (B) in the thermosetting resin composition with respect to a total solid content of 100 parts by weight is preferably 0.01-20 parts by weight, more preferably 0.5-10 parts by weight, and particularly preferably 1-5 parts by weight. A content of the acidic functional group-containing compound as the component (D) in the thermosetting resin composition with respect to a total solid content of 100 parts by weight is preferably 10-80 parts by weight, more preferably 20-50 parts by weight, even more preferably 25-45 parts by weight, and particularly preferably 30-40 parts by weight. By adjusting the amounts of the component (A), the component (B) and the component (D) within the above ranges, the heat resistance and the chemical resistance of the cured film tend to be improved.

A content of the (meth) acryloyl group-containing compound as the component (C) in the thermosetting resin composition with respect to a total solid content of 100 parts by weight is preferably 1-50 parts by weight, more preferably 5-30 parts by weight, even more preferably 7-25 parts by weight, and particularly preferably 10-20 parts by weight. By adjusting the amount of the component (C) within the above range, the warpage of the substrate caused by the cured film tends to be reduced.

Preferred contents of the components (A), (B), (C) and (D) when a sum of the components (A), (B), (C) and (D) in the thermosetting resin composition is 100 parts by weight are as follows. The content of the component (A) is preferably 5-60 parts by weight, more preferably 10-50 parts by weight, and even more preferably 15-40 parts by weight. The content of the component (B) is preferably 0.05-15 parts by weight, more preferably 0.1-10 parts by weight, and even more preferably 0.5-5 parts by weight. The content of the component (C) is preferably 5-60 parts by weight, more preferably 10-50 parts by weight, and even more preferably 15-40 parts by weight. The content of the component (D) is preferably 10-80 parts by weight, more preferably 20-70 parts by weight, and even more preferably 30-50 parts by weight.

The thermosetting resin composition is cured by heating. Therefore, it is not necessary for the thermosetting resin composition to include a photopolymerization initiator for photocuring. When the thermosetting resin composition substantially does not contain a photopolymerization initiator, a reaction of the component (C) caused by light (for example, ultraviolet light of a fluorescent lamp) in a storage environment can be suppressed, and storage stability of the thermosetting resin composition can be improved. Further, by not performing photocuring of the resin composition, a part of the component (C) can remain unreacted, and the warpage of the substrate caused by the cured film can be suppressed. In the thermosetting resin composition, a photopolymerization initiator used for polymerization or the like of the component (D) may remain uncleaved in a small amount. Specifically, a content of the photopolymerization initiator with respect to a total solid content of 100 parts by weight of the thermosetting resin composition is preferably less than 0.05 parts by weight, more preferably less than 0.01 parts by weight, and even more preferably less than 0.001 parts by weight.

The thermosetting resin composition of the present invention preferably substantially does not contain a thermal polymerization initiator, such as a thermal radical initiator or a thermal cationic initiator, promoting thermal curing of the (meth) acryloyl group of the component (C). For a cured film obtained by thermally curing a resin composition that substantially does not contain a thermal polymerization initiator, even when the cured film is heated by processing or the like after curing, curing shrinkable is unlikely to occur and the warpage of the substrate tends to be suppressed. Further, when the thermosetting resin composition substantially does not contain a thermal polymerization initiator, a reaction of the component (C) caused by heat in a storage environment can be suppressed, and storage stability of the thermosetting resin composition can be improved. In the thermosetting resin composition, a thermal polymerization initiator used for polymerization of the component (D) may remain uncleaved in a small amount. Specifically, a content of the thermal polymerization initiator with respect to a total solid content of 100 parts by weight of the thermosetting resin composition is preferably less than 0.05 parts by weight, more preferably less than 0.01 parts by weight, and even more preferably less than 0.001 parts by weight.

In general, a thermosetting resin composition containing a (meth) acryloyl group-containing compound contains a thermal polymerization initiator, and, by promoting radicalization or cationization of the (meth) acryloyl group, a thermosetting speed is increased. In contrast, in the thermosetting resin composition of the present invention, in the presence of a curing accelerator as the component (B), the acidic functional group of the component (D) reacts with the epoxy group of the component (A), and curing progresses. Therefore, even when a thermal polymerization initiator is not contained in the composition and polymerization due to radicalization or cationization of the component (C) does not progress, thermosetting of the composition progresses.

Even in a general thermosetting resin composition that contains a (meth) acryloyl group-containing compound and a thermal polymerization initiator, a part of a thermosetting compound inevitably remains unreacted in a cured film. When a substrate on which a cured film is formed is heated during a process such as formation of an element or hot pressing, a curing shrinkage occurs due to a thermosetting reaction of a thermosetting compound remaining unreacted in the film, and warpage of the substrate tends to increase.

In general, in the absence of a thermal polymerization initiator such as a peroxide, a reaction speed due to thermal energy of a (meth) acryloyl group is smaller than a reaction speed between the epoxy group of the component (A) and the acidic functional group of the component (D). Therefore, when the thermosetting resin composition substantially does not contain a thermal polymerization initiator, by heating, the reaction between the component (A) and the component (D) preferentially proceeds, and an amount of the unreacted component (C) in the cured film is increased as compared to the case where a thermal polymerization initiator is contained. It is thought that, in the cured film obtained by thermally curing the thermosetting resin composition of the present invention, since the unreacted component (C) acts as a plasticizer, a low elasticity and a stress relaxation effect are developed and the warpage of the substrate can be suppressed.

[Other Components]

In addition to the above-described components (A)-(D), when necessary, the thermosetting resin composition may contain the following component (E), the following component (F), a solvent, and the like. The thermosetting resin composition may further contain various additives such as a filler, an adhesion aid, an antifoaming agent, a leveling agent, a coloring agent and a polymerization inhibitor. Contents of the additives may be appropriately set.

<(E) Phosphorus-Based Flame Retardant>

For a purpose of imparting flame retardancy or the like to the cured film, the thermosetting composition may contain a phosphorus-based flame retardant as the component (E). The phosphorus-based flame retardant is a compound containing at least one phosphorus element in a molecule, and examples of the phosphorus-based flame retardant include red phosphorus, condensed phosphoric ester-based compounds, cyclic organophosphorus-based compounds, phosphazene-based compounds, phosphorus-containing (meth) acrylate-based compounds, phosphorus-containing epoxy-based compounds, phosphorus-containing polyol-based compounds, phosphorus-containing amine-based compounds, ammonium polyphosphate, melamine phosphate, phosphinic acid metal salts, and the like. Among these phosphorus-based flame retardants, from a point of view that excellent flame retardancy can be imparted to the cured film, and that there is less flame retardant bleed out from the cured film and contact failure and process contamination can be suppressed, a phosphinic acid metal salt is preferable. A phosphinic acid metal salt is a compound represented by the following formula. In the formula, R1 and R2 are each independently a linear or branched alkyl group or an aryl group having 1-6 carbon atoms, M is a metal selected from a group consisting of Mg, Ca, Al, Sb, Sn, Ge, Ti, Fe, Zr, Zn, Ce, Bi, Sr, Mn, Li, Na and K, and t is an integer of 1-4.

[Chemical Formula 1]

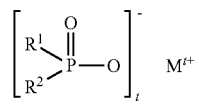

Among phosphinic acid metal salts, from a point of view that high flame retardancy can be obtained, an aluminum salt is preferred, and aluminum trisdiethylphosphinate, aluminum trismethylethylphosphinate, and the like are particularly preferable.

When the thermosetting composition contains a phosphorus-based flame retardant, a content of the phosphorus-based flame retardant with respect to a total solid content of 100 parts by weight is preferably 1-80 parts by weight, more preferably 5-50 parts by weight, and particularly preferably 10-30 parts by weight. When the content of phosphorus-based flame retardant is within the above range, coatability of the thermosetting resin composition can be satisfactorily maintained, flame retardancy and insulation reliability can be imparted to the cured film, and a decrease in folding endurance of the cured film and flame retardant bleed out can be suppressed.

<(F) Organic Spherical Beads>

The thermosetting composition can contain spherical organic beads as the component (F). The spherical organic beads are spherical particles of a polymer containing carbon atoms, and include also elliptical organic beads. Examples of spherical organic beads include polymethyl methacrylate-based spherical organic beads, crosslinked polymethyl methacrylate-based spherical organic beads, crosslinked polybutyl methacrylate-based spherical organic beads, crosslinked acrylic spherical organic beads, acrylic copolymer-based spherical organic beads, crosslinked styrenic spherical organic beads, crosslinked polyacrylic ester-based organic beads, nylon-based spherical organic beads, silicone-based spherical organic beads, crosslinked silicone-based spherical organic beads, crosslinked urethane-based spherical organic beads, and the like. Among these spherical organic beads, from a point of view of improving the flexibility of the cured film and reducing the warpage of the substrate caused by the cured film, it is particularly preferable to use crosslinked urethane-based spherical organic beads containing crosslinked urethane having a urethane bond in a molecule. Surfaces of the spherical organic beads may be coated with hydrophilic or hydrophobic silica.

An average particle size of the spherical organic beads is, for example, about 0.05-20 μm. Since beads having large particle sizes cause insulation failure, it is preferable to use classified spherical organic beads. Specifically, it is preferable that a number ratio of beads having particles sizes of 15 μm or less is 99.99% or more. The particle sizes can be measured using a laser diffraction/scattering type particle size distribution measurement device (for example, model number LA-950V2 manufactured by Horiba Seisakusho Co., Ltd.), and a volume-based median diameter (a particle size for a cumulative distribution value of 50%) is taken as an average particle size.

When the thermosetting composition contains spherical organic beads, a content of the spherical organic beads with respect to a total solid content of 100 parts by weight is preferably 1-80 parts by weight, more preferably 5-50 parts by weight, and particularly preferably 10-30 parts by weight. When the content of the spherical organic beads is within the above range, due to a filling effect, the flexibility of the cured film is improved due to a stress relaxation effect and improvement in fracture toughness, and the warpage of the substrate caused by the cured film tends to be reduced.

That the spherical beads are contained in the cured film can be confirmed by scanning electron microscope observation (for example, magnification of 1000 times) of a cross section. In reflected electron detection (composition mode), a difference in average atomic number of an observation region is strongly reflected in contrast. Therefore, a region where heavy elements exist is observed bright (white), and a region where light elements exist is observed (black). Therefore, organic spherical beads composed of light elements such as carbon, hydrogen, oxygen, and nitrogen are observed as dark (black) circular regions.

<Solvent>

The thermosetting resin composition may further contain a solvent. As the solvent, any solvent capable of dissolving the above components (A)-(D) can be used without particular limitation. Examples of the solvent include sulfoxides, formamides, acetamides, pyrrolidones, phosphoramides, lactones, ethers, acetates, and the like. In the thermosetting resin composition, solvents for the polymerization of the component (D) and for dilution of the components may be contained as they are.

[Preparation of Thermosetting Resin Composition]

A method for preparing the thermosetting resin composition is not particularly limited. The above components (A)-(D), and, when necessary, the components (E) and (F), the solvent and other additives may be mixed. When the component (F) is contained in the thermosetting resin composition, a three-roll mill or the like may be used in order to uniformly disperse the particles in the composition.

[Formation of Cured Film Using Thermosetting Resin Composition]

An embodiment of the cured film of the present invention is a thermally cured film of the above-described thermoplastic resin composition. For example, the cured film is formed by applying the thermosetting resin composition on a substrate and thermally curing the thermosetting resin composition. By forming the cured film on a metal wiring formation surface of a flexible printed board, a flexible printed board with a cured film is obtained. The flexible printed board is obtained, for example, by using a copper-clad laminated plate in which a polyimide film and copper layer are laminated and patterning the copper layer using a subtractive method to form circuits (metal wirings). It is also possible to form metal wirings on a flexible substrate such as a polyimide film using a semi-additive method. Surfaces of the metal wirings may be subjected to a roughening treatment. The surfaces of the metal wirings may also be subjected to a rust preventive treatment, a primer treatment, and the like.

The application of the thermosetting resin composition on the substrate may be selected from screen printing, roller coating, curtain coating, spray coating, spin coating using a spinner, and the like. From a point of view of ease in controlling a film thickness, screen printing is preferable. A coating thickness may be determined by considering a wiring thickness and the like. For example, the coating thickness may be set such that a thickness after curing is about 2-50 µm. The cured film is obtained by heating a coating film. For a purpose of preventing oxidation of the wirings and the like and not lowering adhesion between the wirings and the substrate, it is desirable to perform curing by heating at a low temperature. A final heating temperature during thermal curing is preferably 100° C. or more and 250° C. or less, more preferably 120° C. or more and 200° C. or less, and particularly preferably 130° C. or more and 190° C. or less.

The smaller the relaxation time of the cured film is, the smaller the warpage of the substrate on which the cured film is provided tends to become. The relaxation time of the cured film is preferably 1000 seconds or less, more preferably 800 seconds or less, even more preferably 200 seconds or less, particularly preferably 100 seconds or less, and most preferably 50 seconds or less. The relaxation time (t) of the cured film is calculated based on a simple Maxwell model from a stress relaxation curve obtained from a stress relaxation measurement of a single-layer tensile test of the cured film of the thermosetting resin composition, and is a time until a stress $\sigma$ becomes $\sigma_0/e$, where $\sigma_0$ is an initial stress, and e is the base (2.72) of the natural logarithm.

EXAMPLES

In the following, the present invention is described in detail by illustrating examples. However, the present invention is not limited by these examples.

Synthesis Examples

In the following Synthesis Examples 1-4, polymers (D)-1-(D)-4 having an acidic functional group were polymerized. Characteristics of solutions and polymers obtained in Synthesis Examples 1-4 were evaluated using the following methods.

<Solid Content Concentration>

Measurements were performed according to JIS K 5601-1-2. A drying condition was set to 170° C.×1 hour.

<Weight Average Molecular Weight of Polymer>

Measurements were performed using gel permeation chromatography (GPC) under the following conditions.

Equipment used: Tosoh HLC-8220 GPC equivalent
Columns: Tosoh TSK gel Super AWM-H (6.0 mm I.D.× 15 cm)×2
Guard column: Tosoh TSK guard column Super AW-H
Eluent: 30 mM LiBr+20 mM H3PO4 in DMF
Flow rate: 0.6 mL/min
Column temperature: 40° C.
Detection condition: RI: polarity (+), response (0.5 sec)
Sample concentration: about 5 mg/mL
Molecular weight standard product: PEG (polyethylene glycol).

<Acid Value of Polymers>

Measurements were performed according to JIS K 5601-2-1.

Synthesis Example 1

100.0 g of methyltriglyme (1,2-bis(2-methoxyethoxy)ethane) as a polymerization solvent was charged into a reaction container equipped with a stirrer, a thermometer, a dropping funnel and a nitrogen introducing tube, and temperature was raised to 80° C. while stirring was performed under a nitrogen stream. A mixture containing 12.0 g (0.14 mol) of methacrylic acid, 28.0 g (0.16 mol) of benzyl methacrylate, 60.0 g (0.42 mol) of butyl methacrylate, and 0.5 g of azobisisobutyronitrile as a radical polymerization initiator, which were premixed at a room temperature, was added dropwise from the dropping funnel into the reaction container over 3 hours in a state in which the temperature is kept at 80° C. After completion of the dropwise addition, the reaction solution was heated to 90° C. while being stirred, and was further stirred for two hours while the temperature of the reaction solution was kept at 90° C., and an acrylic polymer solution (D)-1 containing a carboxyl group in a molecule was obtained. A solid content concentration of the solution was 50%, a weight average molecular weight of the polymer was 48,000, and an acid value was 78 mgKOH/g.

Synthesis Example 2

30.00 g of methyltriglyme as a polymerization solvent, and 10.31 g (0.050 mol) of norbornene diisocyanate were charged into a reaction container equipped with a stirrer, a thermometer, a dropping funnel, and a nitrogen inlet tube, and were dissolved by heating the mixture to 80° C. while the mixture was stirred under a nitrogen stream. To this solution, a solution, which was obtained by dissolving 50.00 g (0.025 mol) of polycarbonate diol (manufactured by Asahi Kasei Corporation under a trade name of PCDL T5652 having a weight average molecular weight of 2000) and 3.70 g (0.025 mol) of 2,2-bis (hydroxymethyl) butanoic acid in 30.00 g of methyltriglyme, was added dropwise from the dropping funnel over 1 hour. This solution was heated and stirred at 80° C. for 5 hours to obtain a urethane polymer solution (D)-2 containing a carboxyl group in a molecule. A solid content concentration of the solution was 52%, a weight average molecular weight of the polymer was 5,600, and an acid value was 22 mgKOH/g.

Synthesis Example 3

40.00 g of methyltriglyme as a polymerization solvent, and 20.62 g (0.100 mol) of norbornene diisocyanate were charged into a reaction container equipped with a stirrer, a thermometer, a dropping funnel, and a nitrogen inlet tube, and were dissolved by heating the mixture to 80° C. while the mixture was stirred under a nitrogen stream. To this solution, a solution, which was obtained by dissolving 50.00 g (0.025 mol) of polycarbonate diol, 3.70 g (0.025 mol) of 2,2-bis (hydroxymethyl) butanoic acid, and 13.02 g (0.100 mol) of 2-hydroxyethyl methacrylate in 40.00 g of methyltriglyme, was added dropwise from the dropping funnel over 1 hour. This solution was heated and stirred at 80° C. for 5 hours to obtain a urethane polymer solution (D)-3 containing a carboxyl group and a methacryloyl group in a molecule. A solid content concentration of the solution was 52%, a weight average molecular weight of the polymer was 8,600, and an acid value was 18 mgKOH/g.

Synthesis Example 4

35.00 g of methyltriglyme as a polymerization solvent, and 10.31 g (0.050 mol) of norbornene diisocyanate were charged into a reaction container equipped with a stirrer, a thermometer, a dropping funnel, and a nitrogen inlet tube, and were dissolved by heating the mixture to 80° C. while the mixture was stirred under a nitrogen stream. To this solution, a solution, which was obtained by dissolving 50.00 g (0.025 mol) of polycarbonate diol in 35.00 g of methyltriglyme, was added dropwise from the dropping funnel over 1 hour. After heating and stirring were performed at 80° C. for 2 hours, 15.51 g (0.050 mol) of 3,3',4,4'-oxydiphthalic acid dianhydride was added, and the temperature was raised to 190° C. and heating and stirring were performed for 1 hour. Thereafter, the solution was cooled to 80° C., and 3.60 g (0.200 mol) of pure water was added. The temperature was raised to 110° C. and the solution was heated under reflux for 5 hours, and a urethane imide polymer solution (D)-4 containing a carboxyl group in a molecule was obtained. A solid content concentration of the solution was 53%, a weight average molecular weight of the polymer was 9,200, and an acid value was 86 mgKOH/g.

Examples 1-12 and Comparative Examples 1-9

<Preparation of Thermosetting Resin Composition>

A composition was mixed with formulation shown in Table 1 using a stirring device equipped with general stirring blades, and passed twice through a three roll mill to prepare a thermosetting resin composition as a uniform solution. Particle sizes of a composition containing the component (F) were measured using a grind meter, and the particles sizes were all 10 μm or less.

<Evaluation of Cured Film>

(i) Evaluation of Warpage

The thermosetting resin composition was cast and applied to an area of 100 mm×100 mm on a polyimide film (manufactured by Kaneka Corporation under a trade name of Apical 25 NPI) having a thickness of 25 μm using a Baker type applicator such that a final dry thickness is 20 μm. The thermosetting resin composition is cured by heating for 30 minutes in an oven at 150° C., and a cured film of the hermosetting resin composition is formed on the polyimide film. Only for a resin composition of Comparative Example 9, after thermal curing, photocuring was performed by irradiating ultraviolet light at an accumulated light amount of 100 mJ/cm$^2$ using a DEEP UV LAMP. The polyimide film on which the cured film was formed was cut into an area of 50 mm×50 mm, and a warpage amount in a normal state and a warpage amount after a 5-second heat treatment on a hot plate at 170° C. were measured. The warpage amount measurement was performed by placing the polyimide film with the cured film on a smooth table such that the cured film was on an upper surface side, and measuring a distance between the table and an edge portion of the film.

(ii) Relaxation Time Measurement

A cured film having a thickness of 20 μm was formed on a fluororesin film (manufactured by Nitto Denko Corporation under a trade name of Nitoflon No. 900UL, having a thickness of 0.1 mm) using the same method as in (i) above. The cured film was peeled off from the fluororesin film, and was cut to a size of 1.5 cm×20 cm, and a stress relaxation measurement was performed using a tensile testing machine. Conditions of the stress relaxation test are as follows.

Tensile width: 10 cm
Tensile speed: 50 mm/sec
Tensile strain: 1%
Initial stress: Stress immediately after a tensile strain reaches 1%
Relaxation time: calculated from the simple Maxwell model (iii) Flame Retardancy In accordance with the flame retardancy test standard UL94 of a plastic material, a flame retardancy test was performed as follows. A cured film having a thickness of 25 μm was formed on both sides of a polyimide film having a thickness of 25 μm using the same method as in (i) above. The polyimide film having the cured film formed on both sides thereof (having a thickness of 75 μm) was cut into 50 mm width×200 mm length, and a marking line was placed at a portion of 125 mm in a length direction. The polyimide film was rounded into a tubular shape having a diameter of about 13 mm, and a polyimide tape was pasted on an overlapping portion (at a place of 75 mm) above the marking line and on top so that there was no gap, and a tube for a flame retardancy test was prepared. Twenty tubes for flame retardancy tests were prepared for each of Examples and Comparative Examples. Ten of the tubes were treated under a condition (1): 23° C./50% relative humidity/48 hours, and the other ten tubes were treated for 48 hours at 70° C. and then were cooled for 4 hours or more using desiccator containing anhydrous calcium chloride (condition (2)). These samples were vertically fixed with their tops clamped. A flame of a burner was kept close to a bottom of each sample for 10 seconds to ignite. After 10 seconds, the flame of the burner was moved away, and how many seconds later the flame or combustion of the sample disappeared was measured.

OK: For all of the 20 samples of the conditions (1) and (2), the flame or combustion of a sample stopped and self-extinguished within 10 seconds after the flame of the burner was moved away from the sample.

NG: Among the total of 20 samples, there was one sample for which the flame or combustion did not extinguish within 10 seconds, or there was one burned sample for which the flame rose to the clamp at the top of the sample.

(iv) Electrical Insulation Reliability

A copper foil of a flexible copper-clad laminated plate, which was obtained by laminating a polyimide film having a thickness of 25 μm and an electrolytic copper foil having a thickness of 12 μm using a polyimide-based adhesive, was etched into a comb-shaped pattern having a line width/space width=100 μm/100 μm, and the resulting board was immersed in a 10 vol % sulfuric acid aqueous solution for 1 minute to subject the copper foil to a surface treatment and then was washed with pure water, and thereby, a flexible printed board was prepared. Thereafter, a cured film having a thickness of 20 μm was formed on the comb-shaped pattern of the flexible printed board using the same method as in (i) above, and a flexible printed board with the cured film was prepared. A direct current of 100 V was applied to both terminal portions of a test piece in a testing machine in an environment of 85° C. and a RH of 85%, and, after 1000 hours, insulation performance was evaluated.

A: A resistance value was 109Ω or more, and there was no occurrence of migration, dendrite, or the like.

B: A resistance value was 108Ω or more and less than 109 S, and there was no occurrence of migration, dendrite, or the like.

C: Migration, dendrite, or the like was observed.

(v) Heat Resistance

A flexible printed board with a cured film prepared in the same manner as in (iv) above was floated in a molten solder bath at 260° C. such that a cured film formation surface thereof was in contact with the molten solder bath, and, after 10 seconds, the flexible printed board was pulled up, and external appearance observation was performed and solder heat resistance was evaluated.

OK: No change in external appearance before and after the test.

NG: After the test, the cured film expanded and peeled off from the flexible printed board.

The formulations of the thermosetting resin compositions and the evaluation results of the cured films of Examples and Comparative Examples are listed in Table 1. The numerical values of the components in Table 1 are blending amounts (weight ratios) with a sum (solid content) of the components (A)-(F) being 100 parts by weight. Details of the component are as follows. A blending amount of the component (D) is an amount of a polymer solid content, and an amount of methyltriglyme which is an organic solvent is a total solvent amount including also a solvent contained in the polymer solution (D)-1-4.

TABLE 1

|  |  |  | Example 1 | Example 2 | Example 3 | Example 4 | Example 5 | Example 6 | Example 7 |
|---|---|---|---|---|---|---|---|---|---|
| (A) | JER152 | <1> | 20.6 | 20.6 | 20.6 | 20.6 | 20.6 | — | — |
|  | JER828 | <2> | — | — | — | — | — | 20.6 | — |
|  | JER872 | <3> | — | — | — | — | — | — | 20.6 |
| (B) | DICY-7 | <4> | 2.1 | 2.1 | 2.1 | 2.1 | 2.1 | 2.1 | 2.1 |
| (C) | FA-321M | <5> | 15.5 | 15.5 | 15.5 | 15.5 | 15.5 | 15.5 | 15.5 |
|  | EBECRYL4491 | <6> | — | — | — | — | — | — | — |
|  | EBECRYL3700 | <7> | — | — | — | — | — | — | — |
| (D) | (D)-1 |  | 30.9 | — | — | — | — | — | — |
|  | (D)-2 |  | — | 30.9 | — | — | 15.5 | 15.5 | 15.5 |
|  | (D)-3 |  | — | — | 30.9 | — | — | — | — |
|  | (D)-4 |  | — | — | — | 30.9 | — | — | — |
|  | UXE-3000 | <8> | — | — | — | — | 15.5 | 15.5 | 15.5 |
| (E) | SPB-100 | <9> | — | — | — | — | — | — | — |
|  | Exolit OP935 | <10> | 15.5 | 15.5 | 15.5 | 15.5 | 15.5 | 15.5 | 15.5 |
| (F) | TK-800T | <11> | 15.5 | 15.5 | 15.5 | 15.5 | 15.5 | 15.5 | 15.5 |
|  | GB-055 | <12> | — | — | — | — | — | — | — |
| Initiator | Thermal initiator | <13> | — | — | — | — | — | — | — |
|  | Photoinitiator | <14> | — | — | — | — | — | — | — |
| Other | AC-2000 | <15> | 0.5 | 0.5 | 0.5 | 0.5 | 0.5 | 0.5 | 0.5 |
|  | Methyltriglyme |  | 50 | 50 | 50 | 50 | 50 | 50 | 50 |
| Evaluation results | Warpage (mm) | In normal state | 3 | 2 | 2 | 3 | 2 | 3 | 2 |
|  |  | After heat treatment | 5 | 4 | 4 | 4 | 4 | 4 | 2 |
|  | Relaxation time (seconds) |  | 800 | 800 | 800 | 800 | 500 | 100 | 50 |
|  | Flame retardancy |  | OK | OK | OK | OK | OK | OK | OK |
|  | Heat resistance |  | OK | OK | OK | OK | OK | OK | OK |
|  | Electrical insulation reliability |  | B | B | B | A | B | B | B |

TABLE 1-continued

| | | | Example 8 | Example 9 | Example 10 | Example 11 | Example 12 | Comparative Example 1 | Comparative Example 2 |
|---|---|---|---|---|---|---|---|---|---|
| (A) | JER152 | <1> | — | — | — | — | — | 32.6 | 32.6 |
| | JER828 | <2> | — | — | — | — | — | — | — |
| | JER872 | <3> | 20.6 | 20.6 | 20.6 | 29.9 | 24.4 | — | — |
| (B) | DICY-7 | <4> | 2.1 | 2.1 | 2.1 | 3.0 | 2.4 | 2.2 | 2.2 |
| (C) | FA-321M | <5> | — | — | — | — | — | — | — |
| | EBECRYL4491 | <6> | 15.5 | — | 15.5 | 22.4 | 18.3 | — | — |
| | EBECRYL3700 | <7> | — | 15.5 | — | — | — | — | — |
| (D) | (D)-1 | | — | — | — | — | — | 43.5 | — |
| | (D)-2 | | 15.5 | 15.5 | 15.5 | 22.4 | 18.3 | — | 43.5 |
| | (D)-3 | | — | **** | — | — | — | — | — |
| | (D)-4 | | — | — | — | — | — | — | — |
| | UXE-3000 | <8> | 15.5 | 15.5 | 15.5 | 22.4 | 18.3 | — | — |
| (E) | SPB-100 | <9> | — | — | — | — | — | — | — |
| | Exolit OP935 | <10> | 15.5 | 15.5 | 15.5 | — | — | 21.7 | 21.7 |
| (F) | TK-800T | <11> | 15.5 | 15.5 | — | — | — | — | — |
| | GB-055 | <12> | — | — | 15.5 | — | 18.3 | — | — |
| Initiator | Thermal initiator | <13> | — | — | — | — | — | — | — |
| | Photoinitiator | <14> | — | — | — | — | — | — | — |
| Other | AC-2000 | <15> | 0.5 | 0.5 | 0.5 | 0.5 | 0.5 | 0.5 | 0.5 |
| | Methyltriglyme | | 50 | 50 | 50 | 50 | 50 | 50 | 50 |
| Evaluation results | Warpage (mm) | In normal state | 2 | 2 | 2 | 1 | 0 | 15 | 10 |
| | | After heat treatment | 2 | 3 | 3 | 1 | 1 | 25 | 25 |
| | Relaxation time (seconds) | | 20 | 100 | 100 | 10 | 20 | >1000 | >1000 |
| | Flame retardancy | | OK | OK | OK | NG | NG | OK | OK |
| | Heat resistance | | OK | OK | OK | OK | OK | OK | OK |
| | Electrical insulation reliability | | A | A | A | A | A | A | A |

| | | | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|
| (A) | JER152 | <1> | 32.6 | 41.7 | 24.4 | — | — | 20.6 | 20.6 |
| | JER828 | <2> | — | — | — | — | — | — | — |
| | JER872 | <3> | — | — | — | 24.4 | 29.9 | — | — |
| (B) | DICY-7 | <4> | 2.2 | 2.8 | 2.4 | 2.4 | 3.0 | 2.1 | 2.1 |
| (C) | FA-321M | <5> | — | — | — | — | — | 15.5 | 15.5 |
| | EBECRYL4491 | <6> | — | — | — | — | 22.4 | — | — |
| | EBECRYL3700 | <7> | — | — | — | — | — | — | — |
| (D) | (D)-1 | | — | — | 36.6 | — | — | 30.9 | 30.9 |
| | (D)-2 | | 43.4 | 55.6 | — | 18.3 | — | — | — |
| | (D)-3 | | — | — | — | — | — | — | — |
| | (D)-4 | | — | — | — | — | — | — | — |
| | UXE-3000 | <8> | — | — | — | 18.3 | — | — | — |
| (E) | SPB-100 | <9> | 21.8 | — | — | — | — | — | — |
| | Exolit OP935 | <10> | — | — | 18.3 | 18.3 | 22.4 | 15.5 | 15.5 |
| (F) | TK-800T | <11> | — | — | 18.3 | — | — | 15.5 | 15.5 |
| | GB-055 | <12> | — | — | — | 18.3 | 22.4 | — | — |
| Initiator | Thermal initiator | <13> | — | — | — | — | — | 0.2 | — |
| | Photoinitiator | <14> | — | — | — | — | — | — | 0.2 |
| Other | AC-2000 | <15> | 0.5 | 0.5 | 0.5 | 0.5 | 0.5 | 0.5 | 0.5 |
| | Methyltriglyme | | 50 | 50 | 50 | 50 | 50 | 50 | 50 |
| Evaluation results | Warpage (mm) | In normal state | 5 | 8 | 15 | 20 | 2 | 8 | 15 |
| | | After heat treatment | 10 | 20 | 25 | 30 | 3 | 20 | 25 |
| | Relaxation time (seconds) | | 750 | 900 | >1000 | >1000 | 200 | >1000 | >1000 |
| | Flame retardancy | | OK | NG | OK | OK | OK | OK | OK |
| | Heat resistance | | OK | OK | OK | OK | NG | OK | OK |
| | Electrical insulation reliability | | C | A | A | A | C | B | B |

<1> Manufactured by Mitsubishi Chemical Corporation under a trade name of jER152; phenol novolak type epoxy resin (average molecular weight: 420; epoxy equivalent: 175).
<2> Manufactured by Mitsubishi Chemical Corporation under a trade name of jER828; bisphenol A type epoxy resin (average molecular weight: 370; epoxy equivalent: 190).
<3> Manufactured by Mitsubishi Chemical Corporation under a trade name of jER872; dimer acid-modified type epoxy resin (epoxy equivalent: 650).
<4> Manufactured by Mitsubishi Chemical Corporation under a trade name of DICY7; finely pulverized powder of dicyandiamide.
<5> Manufactured by Hitachi Chemical Industry Co., Ltd. under a trade name of FANCRYL FA-321M; EO-modified bisphenol A dimethacrylate (average molecular weight: 804).
<6> Manufactured by Daicel-Ornecs Co., Ltd. under a trade name of EBECRYL 4491; aliphatic urethane acrylate (average molecular weight: 7000).
<7> Manufactured by Daicel-Ornecs Co., Ltd. under a trade name of EBECRYL 3700; bisphenol A type epoxy acrylate (average molecular weight: 500).
<8> Manufactured by Nippon Kayaku Co., Ltd. under a trade name of KAYARAD UXE-3000; propylene glycol monomethyl ether acetate dilution of acid-modified epoxy acrylate (average molecular weight: 10,000; acid value: 60 mgKOH/g).
<9> Manufactured by Otsuka Chemical Co., Ltd. under a trade name of SPB-100; cyclophosphazene oligomer.
<10> Manufactured by Clariant Chemicals Co., Ltd. under a trade name of Exolit OP935; aluminum diethylphosphinate.
<11> Manufactured by Negami Kogyo Co., Ltd. under a trade name of Art Pearl TK-800T; crosslinked urethane-based spherical organic beads (average particle size: 6 μm).
<12> Manufactured by Aika Kogyo Co., Ltd. under a trade name of Ganz Pearl GB-05S; crosslinked polybutyl methacrylate-based spherical organic beads.
<13> Azoisobutyronitrile manufactured by Tokyo Chemical Industry Co., Ltd.
<14> Manufactured by BASF Corporation under a trade name of OXE-02; oxime ester.
<15> Manufactured by Kyoeisha Chemical Co., Ltd. under a trade name of AC-2000; a butadiene-based defoaming agent.

In Examples 1-12, the warpages in the normal state and after the heat treatment were all 5 mm or less, and good heat resistance and electrical insulation reliability were achieved. In Comparative Example 7 in which the component (D) was not contained, the warpage was less than 5 mm, but heat resistance and electrical insulation reliability were poor. It is thought to be related to that since the acidic functional group-containing compound is not contained in the resin composition, the crosslink density of the cured film is low.

In Comparative Examples 1-4 in which the component (C) was not contained, the warpages in the normal state and after the heat treatment were increased as compared to Examples. Also in Comparative Example 5 for which the component (C) was excluded from the resin composition of Example 1, and in Comparative Example 6 for which the component (C) was excluded from Example 10, the relaxation time of the cured film was increased and the warpage was increased. From these results, it is clear that the warpage of the flexible printed board can be reduced by allowing the thermosetting resin composition to contain the component (C) (a compound having a (meth) acryloyl group).

In Comparative Example 8 for which a thermal polymerization initiator was added to the resin composition of Example 1, the relaxation time of the cured film was increased, and the warpages in the normal state and after the heat treatment were increased. Also in Comparative Example 9 for which a photopolymerization initiator was added to the resin composition of Example 1 and photocuring was performed after thermal curing, the relaxation time and the warpage were increased. As a reason that the warpage caused by the cured film was large in Comparative Example 8 and Comparative Example 9 similar to Comparative Examples 1-6 in which the component (C) was not contained, it is thought that a radical polymerization reaction of the (meth) acryloyl group of the component (C) had progressed due to an effect of the polymerization initiator.

From the above results, in Examples in which the component (C) is contained and a polymerization initiator is not contained, that a portion of the component (C) remains unreacted in the cured film is thought to contribute to the reduction in the warpage.

From a comparison between Examples 1-4, it is clear that, when a urethane imide polymer containing a carboxyl group in a molecule is contained as the component (D), in particular, the insulation reliability tends to be improved. From a comparison between Examples 5-7, it is clear that, when a dimer acid-modified type epoxy resin is contained as the component (A), the relaxation time of the cured film tends to be decreased and the warpage tends to be reduced. From a comparison between Examples 7-9, it is clear that, when urethane acrylate is contained as the component (C), the relaxation time tends to be decreased and the warpage tends to reduced, and the insulation reliability tends to be improved. Further, from a comparison between Example 8 and Example 10, it is clear that the type of the beads contained in the resin composition also affects the warpage amount, and the warpage tends to be reduced when crosslinked urethane-based spherical organic beads are used.

From the above comparison between Examples and Comparative Examples, it is clear that, for the thermosetting resin composition of the present invention containing the components (A)-(D), a warpage caused by a curing shrinkage is unlikely to occur even when the thermosetting resin composition is subjected to thermal processing after thermal curing, and thus, the thermosetting resin composition is suitable as a material of a cured film of a flexible printed board or the like.

What is claimed is:

1. A thermosetting resin composition, comprising:
   an epoxy resin;
   a curing accelerator;
   a compound comprising a (meth) acryloyl group;
   a compound comprising an acidic functional group and having a weight average molecular weight of 1000 or more; and
   an organic spherical bead,
   wherein an amount of each of a photopolymerization initiator and a thermal polymerization initiator in the thermosetting resin composition is less than 0.01 parts by weight per 100 parts by weight of a total solid content of the thermosetting resin composition,
   wherein the organic spherical bead comprises crosslinked urethane, and
   wherein the compound comprising an acidic functional group is an acid-modified polyurethane imide.

2. The thermosetting resin composition according to claim 1, further comprising:
   a phosphorus-based flame retardant.

3. The thermosetting resin composition according to claim 2, wherein the phosphorus-based flame retardant is a phosphinic acid metal salt.

4. A cured film, comprising:
   a thermally cured product of the thermosetting resin composition according to claim 1.

5. The cured film according to claim 4, wherein at least a portion of the compound comprising a (meth) acryloyl group remains unreacted.

6. The cured film according to claim 4, having a relaxation time of 1000 seconds or less.

7. A flexible printed board with a cured film, comprising:
   the cured film according to claim 4 on metal wirings.

8. A method for producing a cured film, comprising:
   forming a coating film by applying the thermosetting resin composition according to claim 1 on a substrate; and
   forming the cured film by applying heat to the coating film such that the thermosetting resin composition is cured.

9. A method for producing a flexible printed board with a cured film, comprising:
   forming a coating film by applying the thermosetting resin composition according to claim 1 on a metal wiring formation surface of a flexible printed board; and
   forming the cured film by applying heat to the coating film such that the thermosetting resin composition is cured.

10. The thermosetting resin composition according to claim 1, wherein the amount of each of the photopolymerization initiator and the thermal polymerization initiator in the thermosetting resin composition is less than 0.001 parts by weight per 100 parts by weight of the total solid content of the thermosetting resin composition.

11. The thermosetting resin composition according to claim 1, wherein the compound comprising an acidic functional group has an acidic value of from 5 to 200 mg KOH/g.

12. The thermosetting resin composition according to claim 1, wherein an amount of the organic spherical bead in the thermosetting resin composition is from 10 to 30 parts by weight per 100 parts by weight of the total solid content of the thermosetting resin composition.

13. The thermosetting resin composition according to claim 1, wherein the compound comprising a (meth) acryloyl group is a urethane (meth)acrylate.

14. The thermosetting resin composition according to claim 1, wherein the epoxy resin is a dimer acid-modified epoxy resin.

* * * * *